(12) United States Patent
Wall

(10) Patent No.: US 12,490,390 B2
(45) Date of Patent: Dec. 2, 2025

(54) DISPLAY DEVICE WITH FLEXIBLE SCREEN ELEMENT AND RESILIENT STRETCHING ELEMENT FOR UNIFORM TENSIONING, AND MOTOR VEHICLE

(71) Applicant: AUDI AG, Ingolstadt (DE)

(72) Inventor: Christian Wall, Hitzhofen (DE)

(73) Assignee: AUDI AG, Ingolstadt (DE)

( * ) Notice: Subject to any disclaimer, the term of this patent is extended or adjusted under 35 U.S.C. 154(b) by 199 days.

(21) Appl. No.: 17/920,525

(22) PCT Filed: Apr. 7, 2021

(86) PCT No.: PCT/EP2021/059041
§ 371 (c)(1),
(2) Date: Oct. 21, 2022

(87) PCT Pub. No.: WO2021/213802
PCT Pub. Date: Oct. 28, 2021

(65) Prior Publication Data
US 2023/0156936 A1    May 18, 2023

(30) Foreign Application Priority Data
Apr. 21, 2020 (DE) ..................... 10 2020 110 760.9

(51) Int. Cl.
*H05K 5/02* (2006.01)
*B60K 35/22* (2024.01)
(Continued)

(52) U.S. Cl.
CPC .......... *H05K 5/0217* (2013.01); *B60K 35/60* (2024.01); *B60K 35/80* (2024.01);
(Continued)

(58) Field of Classification Search
CPC ....... G06F 1/185; G06F 1/184; H05K 7/1418; H05K 7/1489; H05K 7/18; H05K 5/02;
(Continued)

(56) References Cited

U.S. PATENT DOCUMENTS

2012/0268665 A1* 10/2012 Yetukuri ............... B60K 35/00
348/837
2013/0278486 A1   10/2013 Duerksen et al.
(Continued)

FOREIGN PATENT DOCUMENTS

CN        104683522 A     6/2015
CN        205264268 U     5/2016
(Continued)

OTHER PUBLICATIONS

International Search Report (Form PCT/ISA/210); mailed Jun. 15, 2021 in corresponding PCT Application No. PCT/EP2021/059041 (4 pages) (2 pages English Translation).
(Continued)

*Primary Examiner* — Allen L Parker
*Assistant Examiner* — Peter Krim
(74) *Attorney, Agent, or Firm* — STAAS & HALSEY LLP

(57) ABSTRACT

A display device may include a flexible screen element having a screen surface and two frame elements which can be moved relative to one another. A first of the two frame elements is positioned on a first side of the flexible screen element and a second of the two frame elements is positioned on a second side of the flexible screen element opposite the first side. In order to allow improved handling and, as a result, improved useful life of a flexible screen, a resilient stretching element is provided, through which the first side of the screen element is positioned on the first frame element.

19 Claims, 1 Drawing Sheet

(51) Int. Cl.
    *B60K 35/60*   (2024.01)
    *B60K 35/80*   (2024.01)
    *B60R 11/00*   (2006.01)
    *B60R 11/02*   (2006.01)

(52) U.S. Cl.
    CPC ........ *B60R 11/0235* (2013.01); *B60K 35/223* (2024.01); *B60R 2011/0082* (2013.01)

(58) Field of Classification Search
    CPC ........ B60R 11/0235; B60R 2011/0082; B60K 35/80; B60K 35/60; B60K 35/223
    See application file for complete search history.

(56) References Cited

U.S. PATENT DOCUMENTS

| | | | |
|---|---|---|---|
| 2016/0205791 A1* | 7/2016 | Kim | ........................ H05K 13/00 361/679.01 |
| 2016/0363960 A1* | 12/2016 | Park | .................... G09F 15/0062 |
| 2017/0325343 A1 | 11/2017 | Seo et al. | |
| 2020/0125205 A1* | 4/2020 | Ahn | ....................... G06F 1/1637 |

FOREIGN PATENT DOCUMENTS

| | | |
|---|---|---|
| CN | 105807850 A | 7/2016 |
| CN | 106251779 A | 12/2016 |
| CN | 110335546 A | 10/2019 |
| DE | 10115050 B4 | 4/2006 |
| DE | 10 2015 011 614 B4 | 4/2019 |
| DE | 10 2019 117 391 A1 | 1/2020 |
| DE | 10 2020 110 760.9 | 4/2020 |
| EP | 1637387 B1 | 9/2004 |
| EP | 1 637 387 A1 | 3/2006 |
| KR | 10-2014-0099128 A | 8/2014 |
| KR | 10-2016-0087457 | 7/2016 |

OTHER PUBLICATIONS

Written Opinion (Form PCT/ISA/237); mailed Jun. 15, 2021 in corresponding PCT Application No. PCT/EP2021/059041 (5 pages) (5 pages English Translation).
Notification Concerning Transmittal of International Preliminary Report on Patentability (Form PCT/IB/326); mailed Nov. 3, 2022 in corresponding PCT Application No. PCT/EP2021/059041 (1 page).
International Preliminary Report on Patentability (Form PCT/IB/373); mailed Oct. 25, 2022 in corresponding PCT Application No. PCT/EP2021/059041 (1 page).
Examination Report dated Sep. 24, 2020 in corresponding German Patent Application No. 10 2020 110 760.9 (3 pages).
Chinese Office Action dated Jan. 7, 2025 in parallel Chinese Application No. 202180030018.4.
Chinese Office Action dated May 23, 2025 for Chinese Application No. 202180030018.4.
CN 106251779 A corresponds to US 2016/0363960 A1 (Park et al.) in US Office Action dated Aug. 8, 2024.
DE502004009574D1 cited in AM is a German validation number of EP 1 637 387 A1.

* cited by examiner

DISPLAY DEVICE WITH FLEXIBLE SCREEN ELEMENT AND RESILIENT STRETCHING ELEMENT FOR UNIFORM TENSIONING, AND MOTOR VEHICLE

CROSS-REFERENCE TO RELATED APPLICATIONS

This application is a U.S. national stage of International Application No. PCT/EP2021/059041, filed on Apr. 7, 2021. The International Application claims the priority benefit of German Application No. 10 2020 110 760.9 filed on Apr. 21, 2020. Both the International Application and the German Application are incorporated by reference herein in their entirety.

FIELD

The examples relate to a display device with a flexible screen element with a screen surface and two frame elements, which are movable in relation to each other and frame the flexible screen element. An aspect of the examples relate to a motor vehicle with such a display device.

BACKGROUND

Screens in motor vehicles become increasingly larger and are positioned at very different locations in a motor vehicle interior of the motor vehicle. In particular, such screens are provided in an area of a cockpit, for example on a center console and/or on a dashboard, of the motor vehicle. For better integration in the vehicle interior, it is advantageous if a screen is variably configured in its size, for example by a retractable and extendable configuration. For this reason, flexible screens are for example known. Furthermore, it is advantageous if such a screen is touch-sensitive or touch-operable.

Usually, a flexible screen is fixedly adhered to a solid carrier or a solid carrier unit. In other words, a very thin and flexible screen surface can be applied to a solid carrier. Herein, it is disadvantageous that the flexible screen surface has to be applied to the carrier free of bubbles. Bendable carriers are additionally known. Here, the additional disadvantage is present that a high mechanical stress of the screen surface or of driver electronics for controlling the screen surface can result from bending or moving the carrier.

For example, GB 25 03 337 A discloses a cover for a stowage space, wherein a display unit is positioned on one side of the flexible cover. For example, the cover can comprise a roller shutter.

Further, a mobile electronic appliance is known from WO 2015/140 785 A1, which comprises a processor and a screen unit with a resilient material, wherein the screen unit allows change between a first condition, in which a size of the screen unit is stretched, and a second condition, in which the size of the screen unit is shrunk.

Finally, DE 11 2009 005 391 T5 discloses an extensible, flexible display screen, which is attached to a vehicle seat. The screen extends from the interior of the seat via a slit. The screen is a roll-up screen.

SUMMARY

According to the described examples an improved handling, and as a result an improved lifetime, of a flexible screen may be allowed.

The example are the subject matters of the independent claims. Advantageous examples with convenient developments may be the subject matter of the dependent claims.

In an example, a display device is provided with a flexible screen element with a screen surface as well as two frame elements, which are movable in relation to each other, wherein a first one of the two frame elements may be positioned on a first side of the flexible screen element and a second one of the two frame elements may be positioned on a second side of the flexible screen element opposite to the first side. According to the examples, the display device may include a resilient stretching element, through which the first side of the screen element may be positioned on the first frame element.

The two frame elements, namely the first and the second frame element, may be formed to stretch the flexible screen element, in particular the screen surface. In other words, according to the examples, the two frame elements transfer the flexible screen element, in particular the screen surface, into a wrinkle-free, flat condition at least in a used condition of the display device. Hereto, the two frame elements may in particular be positioned on two opposite sides of the flexible screen element. In particular, both frame elements may extend parallel to each other, at least in the used condition. Therein, a condition, in which the display device allows displaying the content on the screen surface for a viewer, is deemed to be the used or in use condition.

It can be possible that the display device is displaceable between the used condition and a stowed condition. In particular, the flexible screen element may take a lower required space in the stowed condition compared to the used condition. However, it can alternatively be provided that the display device is not displaceable and is exclusively present in the used condition in an intended installed condition. In this case, it is in particular not provided that the display device is transferred into the stowed condition.

The resilient stretching element connects the first side of the screen element to the first frame element. In other words, it can be provided that a first side of the stretching element is positioned on the first side of the screen element and a second side of the resilient stretching element is positioned on the first frame element. In particular, the first and the second side of the stretching element are opposite to each other. In particular, the resilient stretching element may be flat. For example, the resilient stretching element is shaped in the manner of a rectangle, wherein the height or thickness of the stretching element is negligibly low compared to the extension in the two spatial directions. In this case, the first and the second side of the stretching element may be different sides of the rectangular stretching element.

Generally, the resilient stretching element connects the flexible screen element to the first frame element. In other words, the screen element may be positioned on and attached to the first frame element, respectively, in particular through the stretching element. Thus, a direct attachment of the screen element to the first frame element may not be present. By the resilience of the stretching element, the resilience allows tensioning the screen element with a spring force resulting from the resilience. Hereto, the resilient stretching element can for example comprise one or more elastic bands, one or more coil springs or one or more stretchable surfaces. In particular, the stretching element may be formed as a stretchable surface.

The resilience of the stretching element may be greater than the resilience of the screen element. This in particular applies in view of the fact that the screen element substantially may not have a resilient behavior. For example, the stretching element can have a linear-elastic correlation of tension and stretching, for example according to the Hooke's law. Alternatively, the Young's modulus of the stretching element can be described by a resilience sensor. In particular, the Young's modulus of the stretching element may be lower than the Young's modulus of the screen element. The resilient stretching element may generate a homogenous force introduction of a tensioning force, which is applied to the first frame element, into the flexible screen element. In this manner, load peaks at individual points of the screen element can be avoided or reduced. In addition, simplified tensioning of the flexible screen element with a defined tensioning force may be possible since stretching and resulting tensioning force on the screen element are provided by the resilient stretching element. In this manner, the stretching element may allow adjusting the tensioning force on the screen element depending on the stretching and in particular a distance between the first and the second frame element. In other words, simplified tensioning of the display device or of the flexible screen element may be allowed by adjusting or presetting the distance between the two frame elements.

According to an example, the stretching element may be attached to the screen element over the entire length of the first side of the screen element. In other words, the entire first side of the screen element may be connected to the stretching element. Thus, a particularly uniform application of the flexible screen element with the tensioning force may result.

According to an example, the stretching element may be attached to the first frame element over the entire length of the first side of the screen element. In other words, a connection of the stretching element to the first frame element may be present over the entire length of the first side of the screen element. In this manner an even more uniform force introduction of the tensioning force into the screen element may be allowed.

According to an example, the flexible screen element comprises a flexible substrate, which is coated with the screen surface. In other words, the screen surface may be deposited or applied to a flexible substrate of the screen element as a coating. In particular, the screen surface may be provided by organic light emitting diodes, so-called OLED. In other words, the flexible substrate can be coated with a plurality of organic light emitting diodes for providing the screen surface. In this manner, a particularly thin and flexible screen element arises. In case of organic light emitting diodes, the display device may be in particular configured as a so-called OLED screen. In order to ensure a high flexibility of the screen element, it can be provided that the screen element comprises exclusively the substrate with the coating by the screen surface in the area of the screen surface. Therein, the substrate may be a thin foil, which is formed for receiving the coating by the screen surface. The substrate or the thin foil can for example have a thickness of 0.5 mm to 1 mm together with the screen surface. Thus, the flexible screen element is in particular 0.5 mm to 1 mm thick, this may apply in the area of the screen surface.

According to an example, the flexible screen element comprises a pixel flexible driver unit configured to control the screen surface, in particular individual pixels of the screen surface. In other words, the driver unit may control individual pixels of the screen surface, and may also be flexibly configured. In this manner, an arrangement of the driver unit as close to the screen surface as possible may be allowed. This may have the advantage that respective signal lines for controlling the individual pixels can be configured particularly short starting from the driver unit and thus low in attenuation. In particular, the flexible driver unit may be connected to each pixel of the screen surface through at least two lines. Thus, in this case, the total number of the lines between driver unit and respective pixels may correspond to at least twice the number of pixels of the screen surface. This is because each pixel may have to be individually controlled by the driver unit for a presentation of the screen content.

According to an example, a display element carrier unit configured to carry the display element may be positioned on the same substrate as the screen surface. In other words, both the screen surface and the flexible driver unit may be positioned on the same flexible substrate. In this manner, the line length of the signal lines for controlling the individual pixels starting from the driver unit can be further reduced.

According to an example, the display device comprises a stowage unit, in which the flexible screen element may be received in a stowed condition of the display device. In particular, the stowage unit may be configured substantially as a housing, which is formed for receiving the flexible screen element in the stowed condition. In further configuration, the display device can comprise a mechanism, which is formed to transfer the flexible screen element between the stowed condition and the used condition. In particular, the mechanism is formed to move one of the two frame elements, in particular the second frame element, in relation to the other frame element, to hereby stretch the screen surface. This mechanism can also be formed to move the flexible screen element in the stowed condition into the stowage unit.

According to an example, the screen element may be stretched in a used condition of the display device, wherein the stretching element and optionally the driver unit are positioned within the stowage unit in the used condition. In other words, the stretching element may be positioned within the stowage unit in the used condition of the display device, while the screen surface is positioned outside of the stowage unit and in particular tensioned. In this manner, the stretching element can be invisibly positioned within the stowage unit even if the display device is in the used condition. Hereby, an improved integration in a motor vehicle interior can be allowed. Optionally, the driver unit can also be positioned within the stowage unit when the display device is in the used condition. In this manner, it can be ensured that the space taken by the display device in the used condition outside of the stowage unit is taken by the screen surface to an extent as large as possible. In other words, the ratio between space requirement outside of the stowage unit and screen surface can be improved hereby.

According to an example, the display device comprises a solid display element carrier unit, the top side of which can be or is attached to the second frame element, wherein the carrier unit provides an, in particular convex, carrier surface for extensively supporting the flexible screen element. In other words, in the used condition of the display device, the flexible screen element or the screen surface may be tensioned over the carrier surface or supported by the carrier surface. Therein, the carrier surface is in particular shaped convexly towards the screen element for improving the support and tension, respectively. The example of the display device with a carrier unit may be independent of the fact whether the display device is displaceable between a used condition and a stowed condition. In other words, the solid carrier unit can also be provided if a displacement of the screen element between the used condition and the stowed condition is not provided. In this case, the second frame element may in particular be fixedly and thus non-removably attached to the surface of the carrier unit. The first frame element can be positioned on the bottom side, which is opposite to the top side, of the carrier unit. In further configuration, the first frame element and/or the second frame element can be provided by the carrier unit. In this case, an integral design of the first and/or second frame elements with the carrier unit can for example be provided. By the solid carrier unit or the carrier surface thereof, a contour, namely that of the carrier surface, can be imparted to the screen element. In addition, a stability of the screen element may be improved. By such a carrier unit, a design of the flexible screen element as a touch-sensitive screen may additionally be possible. In other words, the screen surface can be formed in touch-sensitive manner. In this case, an operating signal can be generated depending on an operation of the touch-sensitive screen surface. For example, the display device comprises an operation signal control unit may be configured to control generation of the operating signal, which is formed hereto. By the carrier unit or the support by the carrier surface, an operation of the touch-sensitive screen surface may be possible in an improved manner.

In an example, a motor vehicle with a display device as is described is within the scope of the present application. In particular, the display device may be positioned in a cockpit area of the motor vehicle, for example, on a dashboard or a center console of the motor vehicle.

The motor vehicle according to the examples may be configured as an automobile, in particular as a passenger car or truck, or as a passenger bus or motorcycle.

Combinations of the described features may be included as examples.

BRIEF DESCRIPTION OF DRAWINGS

These and other aspects and advantages will become more apparent and more readily appreciated from the following description of the examples, taken in conjunction with the accompanying drawings of which.

DETAILED DESCRIPTION

Figure 1:
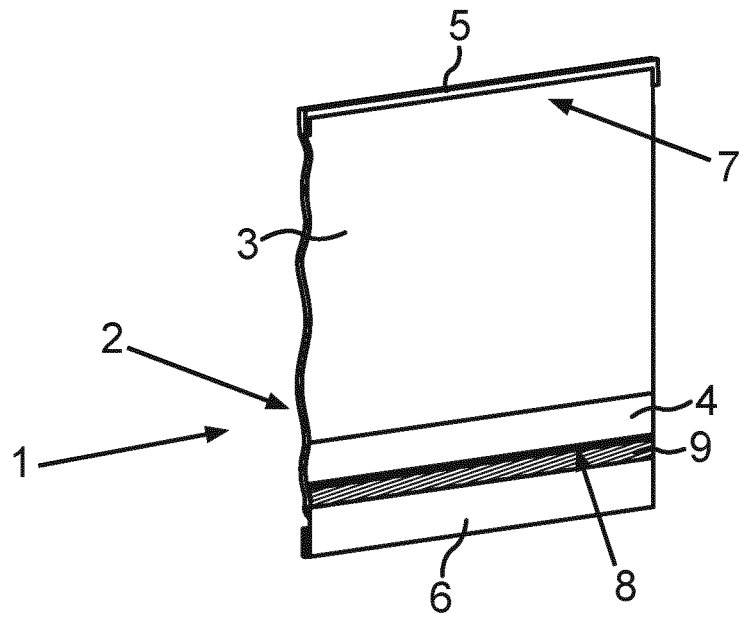
FIG. 1 is a diagram of a display device with a flexible screen element, which is framed by two frame elements, in a non-tensioned condition.

The embodiments explained are examples of an invention. In the examples, the described components of the examples each represent individual features to be considered independently of each other, which each may also refine the examples independently of each other. Therefore, the disclosure is to include also combinations of the features of the examples different from the illustrated ones. Furthermore, the described examples can also be supplemented by further ones of the already described features of the examples.

In the figures, identical reference characters each denote functionally identical elements.

Figure 2:
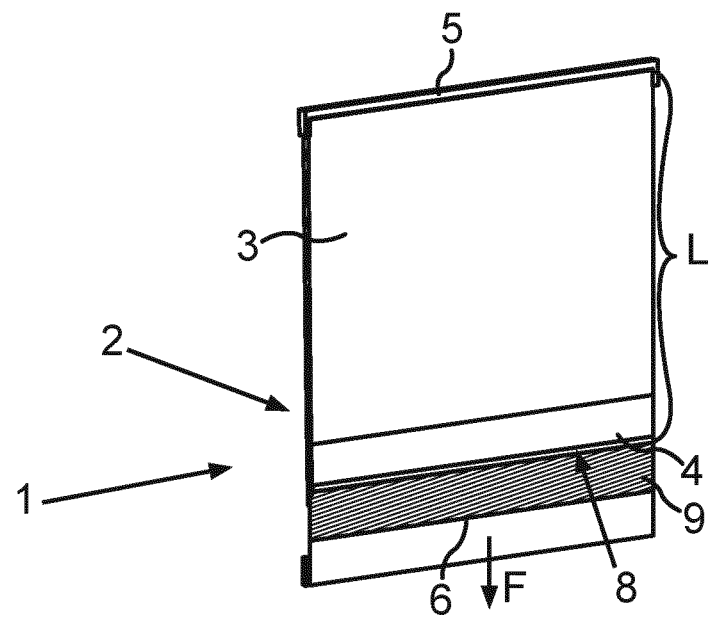
FIG. 2 is a diagram of the display device in the tensioned condition.

FIGS. 1 and 2 show a display device 1 with a flexible screen element 2. The flexible screen element 2 comprises a substrate (not illustrated in the figures), which is coated with a screen surface 3 and comprises a flexible driver unit 4. In other words, the screen surface 3 and the driver unit 4 may be positioned on the same substrate. The screen element 2 with the screen surface 3 and the driver unit 4 may overall be flexible.

The screen element 2, which may be flexible, may be framed by two frame elements 5, 6. Therein, a first side 8 of the screen element 2 may be positioned on a first frame element 6 through a resilient stretching element 9. On a second side 7, the screen element 2 may be directly positioned on a second frame element 5. The first side 8 and the second side 7 of the screen element 2 may be on opposite top and bottom sides of a rectangularly configured screen element 2. The stretching element 9 may be positioned on and attached to the screen element 2, respectively, over the entire length of the first side 8 of the screen element 2. Analogously, the stretching element 9 may be attached to and positioned on the first frame element 6, respectively, over the entire length of the first side 8 of the screen element 2. In this manner, the screen element 2 may be indirectly connected to the first frame element 6 through the stretching element 9 over the entire first side 8. The flexible screen element 2 may be positioned on and attached to the second frame element 5, respectively, over the entire length of the second side 7.

FIG. 2 shows tensioning of the screen element 2 or the screen surface 3 by a tensioning force F, which is exerted on the first frame element 6. Thereupon, a mirror-inverted counterforce can result on the second frame element 5. In other words, the two frame elements 5, 6 may be pulled apart by the tensioning force F. Hereby, a tension on the screen element 2 results. Therein, the screen element 2 may substantially be non-resilient. In other words, no or a negligible length variation of a length L, which the flexible screen element 2 takes between the frame elements 5, 6, results from the tensioning force F. Due to the considerably lower Young's modulus of the stretching element 9 compared to the screen element 2, the stretching element 9 may be stretched by the tensioning force F. Due to the correlation between force and path of a resilient element, therein, the tensioning force F is directly related to the distance of both frame elements 5, 6 to each other. In other words, the tensioning force F can be preset or adjusted corresponding to the extensions of the stretching element 9 and the Young's modulus of the stretching element 9 for a certain distance of the frame elements 5, 6 from each other. In addition, the stretching element 9 may ensure a uniform introduction of the tensioning force F into the screen element 2. In this manner, load peaks at individual points along the first side 8 of the screen element 2 can be avoided. In this manner, a lifetime of the screen element 2 can be improved due to reduced force peaks. Overall, it may be shown by the examples how an arrangement for a tensible, flexible display can be provided.

The description has been provided with particular reference to examples, but it will be understood that variations and modifications can be effected within the spirit and scope of the claims, which may include the phrase "at least one of A, B and C" as an alternative expression that refers to one or more of A, B or C, contrary to the holding in *Superguide v. DIRECTV,* 358 F3d 870, 69 USPQ2d 1865 (Fed. Cir. 2004).

The invention claimed is:
1. A display device, comprising:
a flexible screen element including a screen surface, a first side, and a second side opposite the first side;
a resilient stretching element; and
two frame elements including a first frame element and a second frame element, which frame the flexible screen element and are movable in relation to each other,
wherein
the first side of the flexible screen element is connected to the first frame element indirectly through the resilient stretching element so that the resilient stretching element does not overlap the screen surface, and the second side of the flexible screen element is positioned on the second frame element so that, with the first frame element and the second frame element moved away from each other, a tensioning force is applied to the flexible screen element through the resilient stretching element and the flexible screen element is stretched to be in a use condition.

2. The display device according to claim 1, wherein the resilient stretching element is attached to the flexible screen element over an entire length of the first side of the flexible screen element.

3. The display device according to claim 2, wherein the resilient stretching element is attached to the first frame element over the entire length of the first frame element.

4. The display device according to claim 1, wherein the flexible screen element includes a flexible substrate, which is coated with the screen surface.

5. The display device according to claim 1, wherein the flexible screen element includes a pixel driver to control pixels of the screen surface.

6. The display device according to claim 5, wherein the pixel driver is flexible and positioned on a flexible substrate on which the screen surface is coated.

7. The display device according to claim 1, further comprising:
a stowage unit, in which the flexible screen element is received in a stowed condition of the display device.

8. The display device according to claim 7, wherein, the resilient stretching element and a pixel driver to control pixels of the screen surface are positioned within the stowage unit in the use condition.

9. The display device according to claim 1, further comprising:
a carrier unit, on the second side of the flexible screen element to which the second frame element is attached, wherein the carrier unit provides a carrier surface to extensively support the flexible screen element.

10. A motor vehicle, comprising:
a display device including,
a flexible screen element including a screen surface, a first side, and a second side opposite the first side,
a resilient stretching element, and
two frame elements including a first frame element and a second frame element, which frame the flexible screen element and are movable in relation to each other, wherein
the first side of the flexible screen element is connected to the first frame element indirectly through the resilient stretching element so that the resilient stretching element does not overlap the screen surface, and
the second side of the flexible screen element is positioned on the second frame element so that, with the first frame element and the second frame element moved away from each other, a tensioning force is applied through the resilient stretching element to the flexible screen element and the flexible screen element is stretched to be in a use condition.

11. The motor vehicle according to claim 10, wherein the resilient stretching element is attached to the flexible screen element over an entire length of the first side of the flexible screen element.

12. The motor vehicle according to claim 11, wherein the resilient stretching element is attached to the first frame element over the entire length of the first frame element.

13. The motor vehicle according to claim 10, wherein the flexible screen element includes a flexible substrate, which is coated with the screen surface.

14. The motor vehicle according to claim 10, wherein the flexible screen element includes a pixel driver to control pixels of the screen surface.

15. The motor vehicle according to claim 14, wherein the pixel driver is flexible and positioned on a flexible substrate on which the screen surface is coated.

16. The motor vehicle according to claim 10, further comprising:
a stowage unit, in which the flexible screen element is received in a stowed condition of the display device.

17. The motor vehicle according to claim 16, wherein, the resilient stretching element and a pixel driver to control pixels of the screen surface are positioned within the stowage unit in the use condition.

18. The motor vehicle according to claim 10, further comprising:
a carrier unit, on the second side of the flexible screen element to which the second frame element is attached, wherein the carrier unit provides a carrier surface to extensively support the flexible screen element.

19. A display device, comprising:
a flexible screen element with a screen surface;
a resilient stretching element attached on a first side to a bottom side of the flexible screen element and having a lower Young's modulus than the flexible screen element; and
two frame elements, which are movable in relation to each other, wherein
a first frame element of the two frame elements is attached to a second side of the resilient stretching element that is opposite of the first side of the resilient stretching element so that the flexible screen element is attached to the first frame element through the resilient stretching element and the resilient stretching element does not overlap the screen surface,
a second frame element of the two frame elements is attached to a top side of the flexible screen element opposite to the bottom side of the flexible screen element so that, with the first frame element and the second frame element moved away from each other, a tensioning force is applied to the flexible screen element through the resilient stretching element and the resilient stretching element is stretched to thereby cause the flexible screen element to be in a use condition, and
due to the lower Young's modulus of the resilient stretching element, the tensioning force causes the resilient stretching element to be stretched more than the flexible screen element is stretched.

* * * * *